US007922978B2

(12) United States Patent
Fujioka et al.

(10) Patent No.: US 7,922,978 B2
(45) Date of Patent: Apr. 12, 2011

(54) PLASMA GENERATING ELECTRODE AND PLASMA REACTOR

(75) Inventors: Yasumasa Fujioka, Nagoya (JP); Atsuo Kondo, Nagoya (JP); Masaaki Masuda, Nagoya (JP); Kenji Dosaka, Shioya-gun (JP); Masanobu Miki, Utsunomiya (JP)

(73) Assignees: NGK Insulators, Ltd., Nagoya (JP); Honda Motor Co., Ltd., Tokyo (JP)

( * ) Notice: Subject to any disclaimer, the term of this patent is extended or adjusted under 35 U.S.C. 154(b) by 1108 days.

(21) Appl. No.: 11/313,628

(22) Filed: Dec. 22, 2005

(65) Prior Publication Data
US 2006/0138957 A1    Jun. 29, 2006

(30) Foreign Application Priority Data

Dec. 27, 2004    (JP) ................................. 2004-377092

(51) Int. Cl.
*B01J 19/08* (2006.01)
(52) U.S. Cl. ................... 422/186.04; 422/186
(58) Field of Classification Search .............. 422/186.04
See application file for complete search history.

(56) References Cited

U.S. PATENT DOCUMENTS

| | | |
|---|---|---|
| 2002/0028163 A1 | 3/2002 | Nelson et al. |
| 2002/0174938 A1 | 11/2002 | Li et al. |
| 2003/0007907 A1* | 1/2003 | Nelson et al. ............ 422/186.04 |
| 2003/0180199 A1* | 9/2003 | Kim et al. ...................... 422/186 |
| 2003/0230938 A1* | 12/2003 | Hatano et al. ................. 307/106 |
| 2006/0133970 A1* | 6/2006 | Imanishi et al. .............. 422/186 |

FOREIGN PATENT DOCUMENTS

| | | |
|---|---|---|
| EP | 1 643 093 A1 | 4/2006 |
| JP | A 2004-245096 | 9/2004 |
| WO | WO 2004072445 A1 * | 8/2004 |

* cited by examiner

*Primary Examiner* — Harry D Wilkins, III
*Assistant Examiner* — Bryan D. Ripa
(74) *Attorney, Agent, or Firm* — Oliff & Berridge, PLC

(57) ABSTRACT

A plasma generating electrode includes two types of plate-shaped unit electrodes of different polarities, the two types of unit electrodes of different polarities being hierarchically and alternately stacked at specific intervals, a discharge space for generating plasma being formed between the opposing unit electrodes, each of the unit electrodes of one polarity among the two types of unit electrodes of different polarities including a plate-shaped conductor exhibiting conductivity and a ceramic dielectric disposed to cover the conductor, the ceramic dielectric of the unit electrode of one polarity including a support protrusion for forming the discharge space for generating plasma between the opposing unit electrodes and at least a part of a space in which the unit electrode of the other polarity is disposed opposite to the unit electrode of one polarity and for supporting the unit electrode of one polarity, the support protrusion being integrally formed with the ceramic dielectric on at least one surface of the ceramic dielectric on at least one end of the ceramic dielectric in one direction.

13 Claims, 6 Drawing Sheets

US 7,922,978 B2

PLASMA GENERATING ELECTRODE AND PLASMA REACTOR

BACKGROUND OF THE INVENTION

1. Field of the Invention

The invention relates to a plasma generating electrode and a plasma reactor. More particularly, the invention relates to a plasma generating electrode and a plasma reactor in which hierarchically stacked unit electrodes are accurately and simply positioned and deformation of the unit electrodes due to thermal stress is effectively prevented.

2. Description of Related Art

A silent discharge occurs when disposing a dielectric between two electrodes secured on each end and applying a high alternating current voltage or a periodic pulsed voltage between the electrodes. In the resulting plasma field, active species, radicals, and ions are produced to promote a gaseous reaction and decomposition. This phenomenon may be utilized to remove toxic components contained in engine exhaust gas or incinerator exhaust gas.

For example, a plasma reactor has been disclosed such as an air cleaner utilizing ozone or a plasma reactor which treats $NO_x$, particulate matter (PM) such as carbon particulate, HC, CO, or the like contained in exhaust gas discharged from an engine or an incinerator by causing the exhaust gas to pass through the above-described plasma field (e.g. U.S.2002/0174938A1). Such a plasma reactor includes a plasma generating electrode in which a plurality of electrodes, in which a conductor is printed inside a ceramic dielectric, are stacked, for example. U.S.2002/0174938A1 also discloses a plasma generating electrode in which a support member (e.g. ceramic plate) which adjusts the electrode-to-electrode interval and supports the electrode is integrally formed with the electrode.

SUMMARY OF THE INVENTION

According to the plasma generating electrode disclosed in U.S. 2002/0174938 A1 in which the support member (e.g. ceramic plate) is integrated with the electrode, a reliable electrode stacked structure can be obtained when disposing the electrodes including the same type of ceramic dielectric in opposition to each other. However, when the opposing electrodes (i.e. electrodes of different polarities) have different coefficients of thermal expansion or Young's moduli, the electrode may be deformed due to thermal stress or the positions of the stacked electrodes may change when vibration or the like is applied.

The invention was achieved in view of the above-described problems. Specifically, the invention provides a plasma generating electrode and a plasma reactor in which hierarchically stacked unit electrodes are accurately and simply positioned and deformation of the unit electrodes due to thermal stress is effectively prevented.

The invention provides the following plasma generating electrode and plasma reactor.

[1] A plasma generating electrode comprising two types of plate-shaped unit electrodes of different polarities, the two types of unit electrodes of different polarities being hierarchically and alternately stacked at specific intervals, a discharge space for generating plasma being formed between the opposing unit electrodes, each of the unit electrodes of one polarity among the two types of unit electrodes of different polarities including a plate-shaped conductor exhibiting conductivity and a ceramic dielectric disposed to cover the conductor, the ceramic dielectric of the unit electrode of one polarity including a support protrusion for forming the discharge space for generating plasma between the opposing unit electrodes and at least a part of a space in which the unit electrode of the other polarity is disposed opposite to the unit electrode of one polarity and for supporting the unit electrode of one polarity, the support protrusion being integrally formed with the ceramic dielectric on at least one surface of the ceramic dielectric on at least one end of the ceramic dielectric in one direction (hereinafter may be referred to as "first aspect of the invention").

[2] The plasma generating electrode according to [1], wherein the two types of unit electrodes of different polarities are formed of different materials.

[3] The plasma generating electrode according to [1] or [2], wherein the unit electrode of the other polarity is formed by a plate-shaped member having a coefficient of thermal expansion and/or a Young's modulus differing from a coefficient of thermal expansion and/or a Young's modulus of the ceramic dielectric forming the unit electrode of one polarity.

[4] The plasma generating electrode according to any of [1] to [3], wherein the unit electrode of the other polarity is formed by a plate-shaped conductive metal or alloy member exhibiting conductivity.

[5] The plasma generating electrode according to any of [1] to [4], wherein the space which is formed by allowing the support protrusion to support the unit electrode of one polarity and in which the unit electrode of the other polarity is disposed has a length in a direction of a thickness of the unit electrode of the other polarity greater than the thickness of the unit electrode of the other polarity.

[6] The plasma generating electrode according to any of [1] to [4], wherein the space which is formed by allowing the support protrusion to support the unit electrode of one polarity and in which the unit electrode of the other polarity is disposed has a length in a direction of a thickness of the unit electrode of the other polarity equal to or smaller than the thickness of the unit electrode of the other polarity.

[7] The plasma generating electrode according to any of [1] to [6], wherein a distance of the support protrusion from a surface forming the discharge space to an end face on the end in the direction is equal to or greater than five times a distance between the unit electrode of one polarity and the unit electrode of the other polarity opposite to each other.

[8] The plasma generating electrode according to any of [1] to [7], wherein the ceramic dielectric forming the unit electrode of one polarity includes at least one compound selected from the group consisting of aluminum oxide, magnesium oxide, silicon oxide, silicon nitride, aluminum nitride, mullite, spinel, cordierite, magnesium-calcium-titanium type oxide, barium-titanium-zinc type oxide, and barium-titanium type oxide.

[9] The plasma generating electrode according to any of [1] to [8], wherein the ceramic dielectric forming the unit electrode of one polarity is formed by stacking a plate-shaped ceramic member and a protrusion member forming the support protrusion.

[10] The plasma generating electrode according to any of [1] to [9], wherein the ceramic dielectric forming the unit electrode of one polarity includes at least one metal selected from the group consisting of tungsten, molybdenum, manganese, chromium, titanium, zirconium, nickel, iron, silver, copper, platinum, and palladium.

[11] A plasma reactor comprising the plasma generating electrode according to any of [1] to [10], and a casing having a passage (gas passage) for a gas containing a specific component formed therein, wherein, when the gas is introduced into the gas passage of the casing, the specific component contained in the gas can be reacted by plasma generated by the plasma generating electrode (hereinafter may be referred to as "second aspect of the invention").

[12] The plasma reactor according to [11], comprising at least one pulsed power supply for applying voltage to the plasma generating electrode

[13] The plasma reactor according to [12], wherein the pulsed power supply includes at least one SI thyristor.

In the plasma generating electrode according to the invention, the hierarchically stacked unit electrodes are accurately and simply positioned, and deformation of the unit electrodes due to thermal stress is effectively prevented. Since the plasma reactor according to the invention includes the above-described plasma generating electrode, the plasma reactor can cause exhaust gas discharged from an engine, an incinerator, or the like to be effectively reacted.

DETAILED DESCRIPTION OF PREFERRED EMBODIMENT

Embodiments of the plasma generating electrode and the plasma reactor according to the invention (first and second aspect of the inventions) are described below in detail with reference to the drawings. However, the invention should not be construed as being limited to the following embodiments. Various alterations, modifications, and improvements may be made within the scope of the invention based on knowledge of a person skilled in the art.

Figure 1:
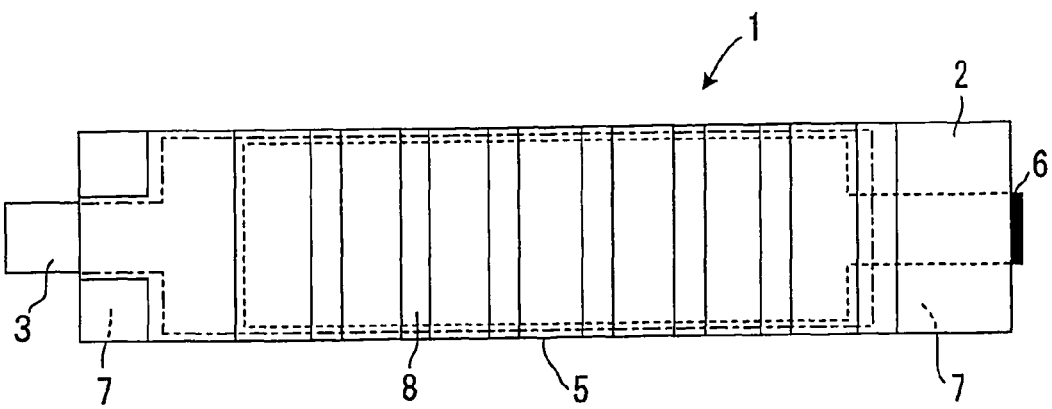
FIG. 1 is a plan view of one embodiment of a plasma generating electrode according to the invention (first aspect of the invention) viewed from the surface side of a unit electrode.
Figure 2:
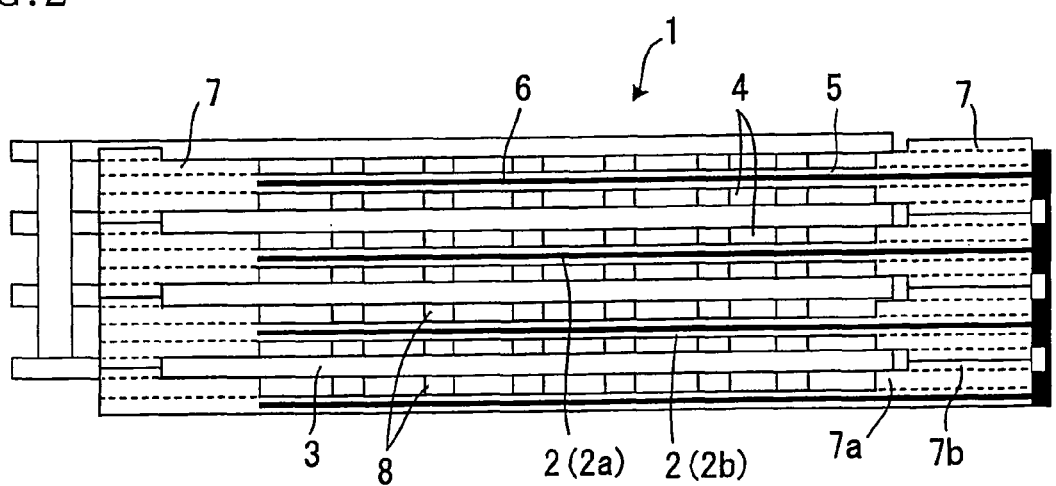
FIG. 2 is a cross-sectional view of the plasma generating electrode shown in FIG. 1 along a plane perpendicular to the surface of the unit electrode.
Figure 3:
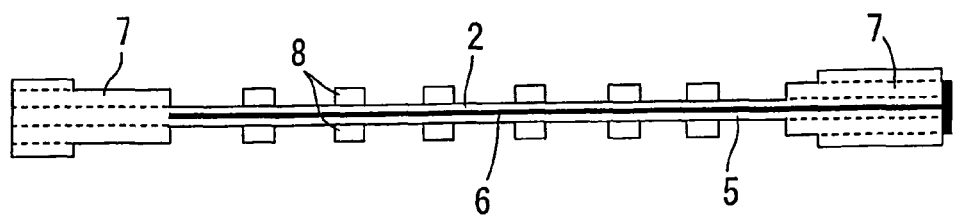
FIG. 3 is a cross-sectional view showing the unit electrode of the plasma generating electrode shown in FIG. 1.

One embodiment of the plasma generating electrode according to the invention (first aspect of the invention) is described below in detail. FIG. 1 is plan view of one embodiment of the plasma generating electrode according to the invention (first aspect of the invention) viewed from the surface side of a unit electrode, FIG. 2 is a cross-sectional view of the plasma generating electrode shown in FIG. 1 along a plane perpendicular to the surface of the unit electrode, and FIG. 3 is a cross-sectional view showing the unit electrode of the plasma generating electrode shown in FIG. 1. As shown in FIGS. 1 to 3, a plasma generating electrode 1 according to one embodiment of the invention includes two types of plate-shaped unit electrodes 2 and 3 of different polarities, the two types of unit electrodes 2 and 3 of different polarities being hierarchically and alternately stacked at specific intervals, a discharge space 4 for generating plasma being formed between the opposing unit electrodes 2 and 3, each of the unit electrodes 2 of one polarity among the two types of unit electrodes 2 and 3 of different polarities including a plate-shaped conductor 6 exhibiting conductivity and a ceramic dielectric 5 disposed to cover the conductor 6, the ceramic dielectric 5 of the unit electrode 2 of one polarity including a support protrusion 7 for forming the discharge space 4 for generating plasma between the opposing unit electrodes 2 and 3 and at least a part of a space in which the unit electrode 3 of the other polarity is disposed opposite to the unit electrode 2 of one polarity and for supporting the unit electrode 2 of one polarity, the support protrusion 7 being integrally formed with the ceramic dielectric 5 on at least one surface of the ceramic dielectric 5 on at least one end of the ceramic dielectric 5 in one direction. The support protrusion 7 of the plasma generating electrode 1 according to one embodiment of the invention includes a portion 7a for forming the discharge space and a portion 7b for forming an opening in which the unit electrode of the other polarity is disposed.

As described above, the plasma generating electrode 1 according to one embodiment of the invention is configured so that the ceramic dielectric 5 of the unit electrode 2 of one polarity includes the support protrusion 7 for forming the discharge space 4 for generating plasma between the opposing unit electrodes 2 and 3 and at least a part of the space in which the unit electrode 3 of the other polarity is disposed opposite to the unit electrode 2 of one polarity and for supporting the unit electrode 2 of one polarity, the support protrusion 7 being integrally formed with the ceramic dielectric 5 on at least one surface of the ceramic dielectric 5 on at least one end of the ceramic dielectric 5 in one direction (direction perpendicular to the direction in which the discharge space 4 communicates with the outer space in FIGS. 1 and 2), and two adjacent unit electrodes 2a and 2b of one polarity are supported by the support protrusions 7. Therefore, the hierarchically stacked unit electrodes 2 and 3 are accurately and simply positioned, and deformation of the unit electrodes 2 and 3 due to thermal stress is effectively prevented.

In the plasma generating electrode 1 according to one embodiment of the invention, it is preferable that the two types of unit electrodes 2 and 3 of different polarities, that is, the unit electrode 2 of one polarity and the unit electrode 3 of the other polarity, be formed of different materials. In the case where the two types of unit electrodes 2 and 3 of different polarities are formed of different materials, the unit electrode 3 of the other polarity is not particularly limited insofar as the unit electrode 3 can generate plasma in the discharge space 4 upon application of voltage between the unit electrode 2 of one polarity and the unit electrode 3 of the other polarity. In more detail, it is preferable that the unit electrode 3 of the other polarity be formed by a plate-shaped member having a coefficient of thermal expansion and/or a Young's modulus differing from the coefficient of thermal expansion and/or Young's modulus of the ceramic dielectric 5 of the unit electrode 2 of one polarity. The material for the unit electrode 3 may have a dielectric constant differing from the dielectric constant of the ceramic dielectric 5. If the two types of unit electrodes 2 and 3 of different polarities are formed of different materials, the plasma generating electrode 1 exhibiting high reaction efficiency and excellent structural reliability can be manufactured at low cost.

The unit electrode 3 of the other polarity may be an electrode formed by a plate-shaped conductive metal or alloy member exhibiting conductivity, for example. Or, the unit electrode 3 of the other polarity may include a ceramic dielectric (not shown) formed of a ceramic and a conductor (not shown) disposed inside the ceramic dielectric (not shown) in the same manner as the unit electrode 2 of one polarity. When the unit electrode 3 of the other polarity includes a ceramic dielectric (not shown), it is preferable that the material for the ceramic dielectric (not shown) of the unit electrode 3 of the other polarity differ from the material for the ceramic dielectric 5 of the unit electrode 2 of one polarity.

In the plasma generating electrode 1 according to one embodiment of the invention, when the unit electrode 3 of the other polarity is an electrode formed by a plate-shaped conductive metal or alloy member exhibiting conductivity, it is preferable that the unit electrode 2 including the ceramic dielectric 5 with high secondary emission performance be used as the electron emission side electrode. When the unit electrode 3 of the other polarity also includes a ceramic dielectric (not shown), it is preferable that one of the opposing unit electrodes 2 and 3 which is formed of a ceramic with higher secondary emission performance be used as the electron emission side electrode.

The ceramic dielectric 5 of the unit electrode 2 of one polarity preferably has relatively high mechanical strength, and preferably includes at least one compound selected from the group consisting of aluminum oxide, magnesium oxide, silicon oxide, silicon nitride, aluminum nitride, mullite, spinel, cordierite, magnesium-calcium-titanium type oxide, barium-titanium-zinc type oxide, and barium-titanium type oxide. This configuration enables the plasma generating electrode 1 with excellent heat resistance and high reaction efficiency to be obtained.

The ceramic dielectric 5 used in one embodiment of the invention may be formed by using a tape-shaped unfired ceramic formed body, such as a ceramic green sheet formed in the shape of a tape by a doctor blade method. The ceramic dielectric 5 may also be formed by using a sheet obtained by extrusion. A flat plate formed by powder dry pressing may also be used.

The support protrusion 7 is integrally formed with the ceramic dielectric 5 of the unit electrode 2 of one polarity. The support protrusion 7 having a specific shape may be integrally formed with the ceramic dielectric 5 by forming a protrusion member which has a specific thickness and forms the support protrusion 7 using a material similar to that of the ceramic green sheet, such as a material containing at least one compound selected from the group consisting of aluminum oxide, magnesium oxide, silicon oxide, silicon nitride, aluminum nitride, mullite, spinel, cordierite, magnesium-calcium-titanium type oxide, barium-titanium-zinc type oxide, and barium-titanium type oxide, by a tape forming method such as a doctor blade method, stacking the resulting protrusion member on the above-mentioned ceramic green sheet, and firing the resulting product so that the ceramic green sheet and the protrusion member are integrally formed. The support protrusion 7 may also be formed by using a sheet obtained by extrusion as the protrusion member. A protrusion forming the support protrusion 7 may be formed when extruding the above-mentioned ceramic green sheet to integrally form the support protrusion 7 with the ceramic dielectric 5.

The conductor 6 forming the plasma generating electrode 1 according to one embodiment of the invention is not particularly limited insofar as plasma can be generated in the discharge space 4 formed between the unit electrodes 2 and 3 by applying voltage between the unit electrode 2 of one polarity and the unit electrodes 3 of the other polarity. For example, the conductor 6 preferably includes at least one metal selected from the group consisting of tungsten, molybdenum, manganese, chromium, titanium, zirconium, nickel, iron, silver, copper, platinum, and palladium.

The method of disposing the conductor 6 inside the ceramic dielectric 5 is not particularly limited. For example, the conductor 6 may be formed and disposed inside the ceramic dielectric 5 by applying a conductive paste, which is prepared by mixing a powder of a metal mentioned above as the preferable material for the conductor 6, an organic binder, and a solvent such as terpineol, to the ceramic green sheet forming the ceramic dielectric 5. As preferable examples of the specific application method, screen printing, calender rolling, spraying, electrostatic painting, dip coating, knife coating, inkjetting, chemical vapor deposition, physical vapor deposition, and the like can be given. According to these methods, the conductor 6 which can be easily formed in a specific shape such as a lattice shape by application, exhibits excellent surface smoothness (flatness), and has a small thickness can be easily formed.

The conductor 6 is disposed inside the ceramic dielectric 5. It is preferable that the conductor 6 be electrically connected with the outside of the unit electrode 2 on at least a part of the end of the ceramic dielectric 5. For example, it is preferable to dispose the conductor 6 to extend to the outside of the ceramic dielectric 5 on at least a part of the end of the ceramic dielectric 5 to achieve electrical connection with the outside by the portion extending to the outside of the ceramic dielectric 5.

Figure 4:
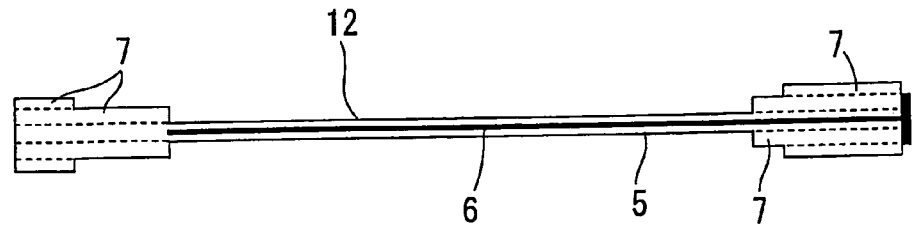
FIG. 4 is a cross-sectional view showing an example of the unit electrode forming another embodiment of the plasma generating electrode according to the invention (first aspect of the invention).
Figure 5:
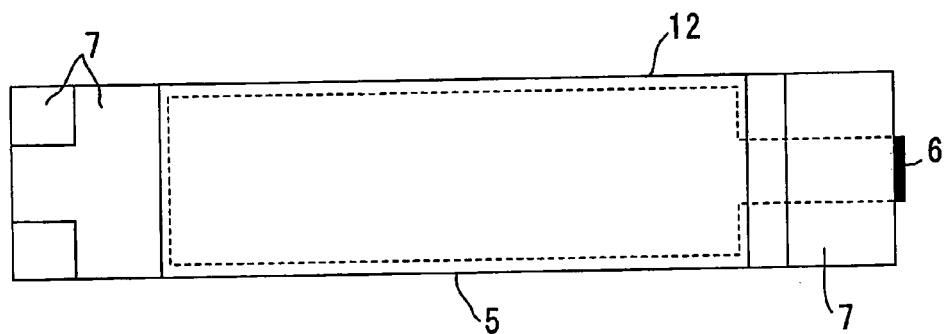
FIG. 5 is a plan view of the unit electrode shown in FIG. 4 viewed from its surface side.

The plasma generating electrode 1 shown in FIGS. 1 and 2 includes a plurality of protrusions 8 having a specific thickness and disposed in a specific pattern on the ceramic dielectric 5 of the unit electrode 2 of one polarity on the surface opposite to the unit electrode 3 of the other polarity. The protrusions 8 partition the discharge space 4 to stabilize plasma generated in the discharge space 4. The protrusion 8 prevents deformation of the unit electrodes 2 and 3 so that uniform plasma can be generated between the opposing unit electrodes 2 and 3. Note that the protrusion 8 need not necessarily be provided. As shown in FIGS. 4 and 5, the plasma generating electrode may include a unit electrode 12 of one polarity on which the protrusion 8 (see FIG. 1) is not disposed, for example. FIG. 4 is a cross-sectional view showing an example of the unit electrode forming another embodiment of the plasma generating electrode according to the invention. FIG. 5 is a plan view of the unit electrode shown in FIG. 4 viewed from its surface side. In FIGS. 4 and 5, elements configured in the same manner as the elements shown in FIGS. 1 to 3 are indicated by the same symbols. Description of these elements is omitted.

In the plasma generating electrode 1 shown in FIGS. 1 to 3, it is preferable that the protrusion 8 be integrally formed with the ceramic dielectric 5 of the unit electrode 2 of one polarity. It is preferable that the protrusion 8 be formed of a material similar to the material for the ceramic dielectric 5, such as a material containing at least one compound selected from the group consisting of aluminum oxide, magnesium oxide, silicon oxide, silicon nitride, aluminum nitride, mullite, spinel, cordierite, magnesium-calcium-titanium type oxide, barium-titanium-zinc type oxide, and barium-titanium type oxide.

Figure 6:
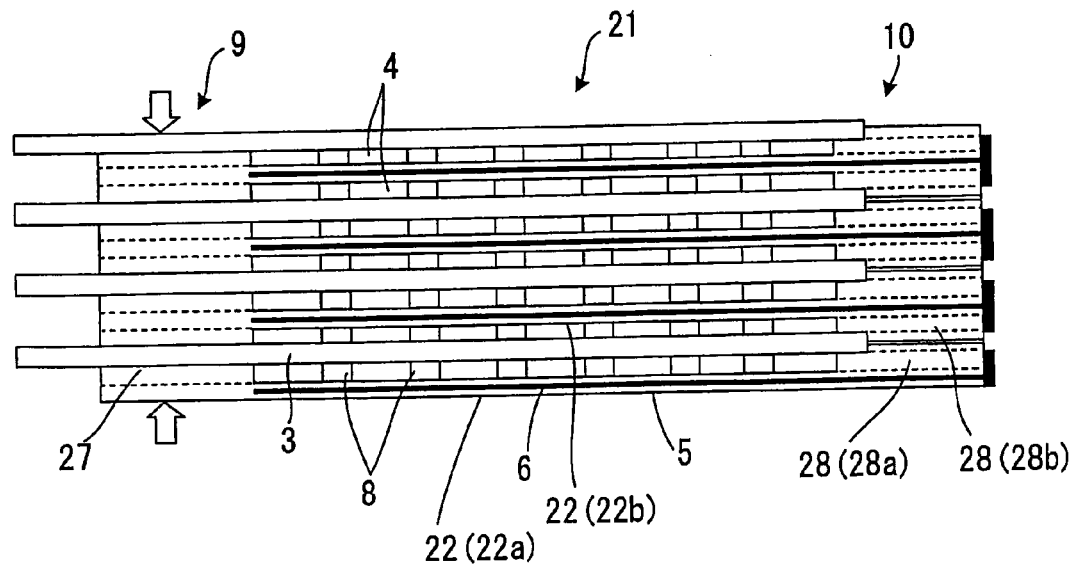
FIG. 6 is a cross-sectional view of another embodiment of the plasma generating electrode according to the invention (first aspect of the invention) along a plane perpendicular to the surface of the unit electrode.
Figure 7:
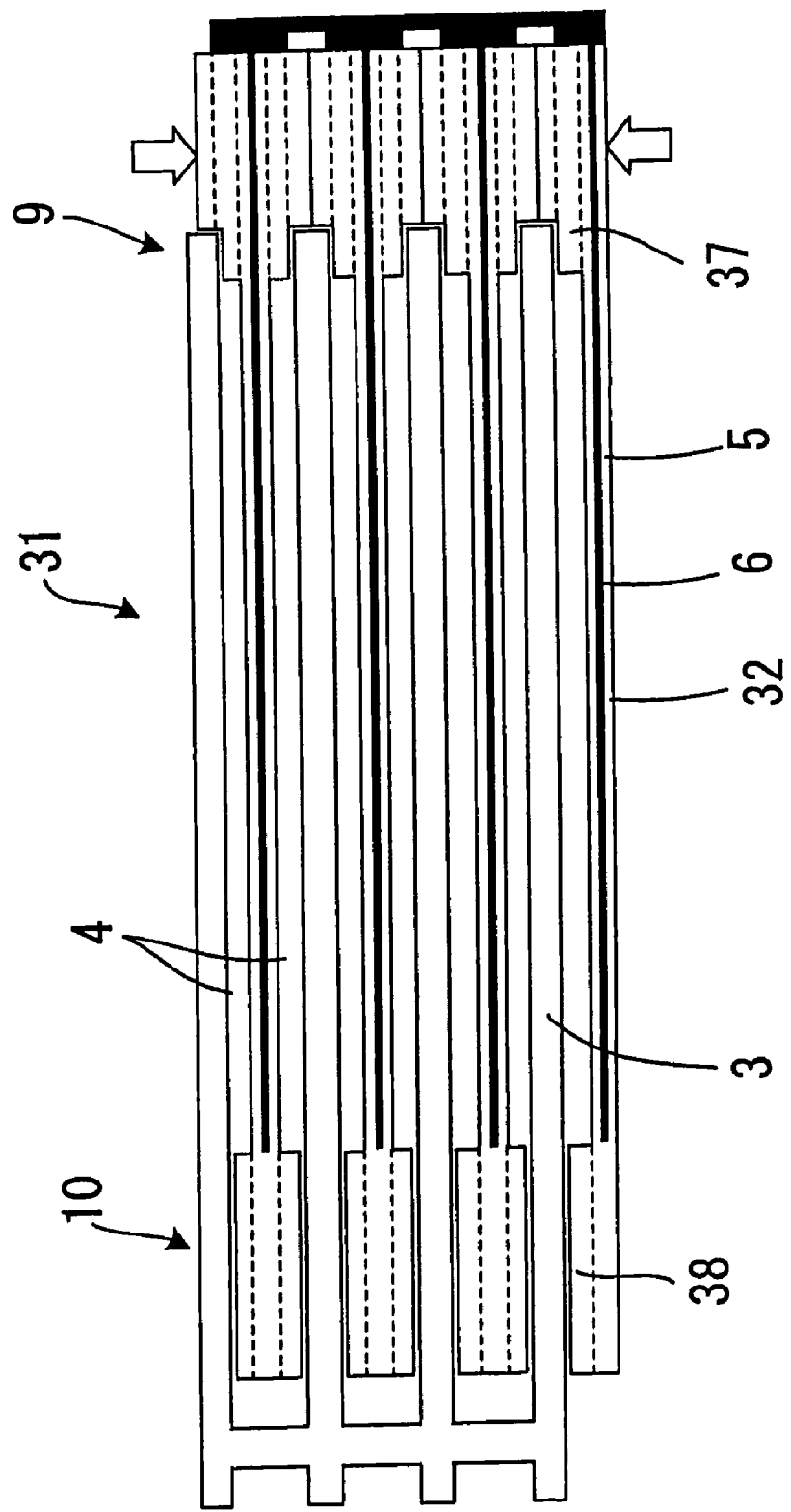
FIG. 7 is a cross-sectional view of another embodiment of the plasma generating electrode according to the invention (first aspect of the invention) along a plane perpendicular to the surface of the unit electrode.

In the plasma generating electrode 1 shown in FIGS. 1 to 3, the support protrusion 7 is formed on each end of the unit electrode 2 of one polarity in one direction, and supports the unit electrode 2 on each end. As shown in FIGS. 6 and 7, plasma generating electrodes 21 and 31 may also be formed in which unit electrodes 22 and 32 of one polarity are supported on only one end of the unit electrodes 22 and 32 in one direction, for example.

In the plasma generating electrode 21 shown in FIG. 6, the space which is formed by allowing support protrusions 27 and 28 to support the unit electrodes 22 of one polarity and in which the unit electrode 3 of the other polarity is disposed has a length in the direction of the thickness of the unit electrode 3 of the other polarity equal to or smaller than the thickness of the unit electrode 3 of the other polarity. In the plasma generating electrode 21 having the above-described configuration, when the unit electrode 22 of one polarity and the unit electrode 3 of the other polarity exhibit different degrees of thermal expansion, stress occurring between the unit electrode 22 of one polarity and the unit electrode 3 of the other polarity due to thermal expansion can be reduced by the opening between the support protrusions 28. In FIG. 6, the support protrusion 27 on one end 9 in one direction has a thickness corresponding to the width of the discharge space 4, and the unit electrode 22 is supported by allowing the support protrusions 27 to sandwich the unit electrode 3 of the other polarity on one end 9, so that the unit electrode 3 of the other polarity is secured on one end 9. The support protrusion 28 on the other end 10 in one direction has such a thickness that an opening is formed between support protrusions 28a and 28b of two adjacent unit electrodes 22a and 22b of one polarity, that is, has a thickness smaller than the total of the width of the discharge space 4 and the half width of the unit electrode 3 of the other polarity.

In the plasma generating electrode 31 shown in FIG. 7, the space which is formed by allowing support protrusions 37 to support the unit electrodes 32 of one polarity and in which the unit electrode 3 of the other polarity is disposed has a length in the direction of the thickness of the unit electrode 3 of the other polarity greater than the thickness of the unit electrode 3 of the other polarity. In more detail, the support protrusion 37 on one end 9 in one direction has a thickness greater than the total of the width of the discharge space 4 and the half the width of the unit electrode 3 of the other polarity, and a support protrusion 38 on the other end 10 in one direction has a thickness smaller than the width of the discharge space 4. In the plasma generating electrode 31, the unit electrode 32 of one polarity is supported by applying surface pressure to two adjacent unit electrodes 32 of one polarity on one end 9 so that the support protrusions 37 come in contact with each other on one end. The unit electrodes 3 of the other polarity are connected on the other end 10. In the plasma generating electrode 31 shown in FIG. 7, the unit electrode 32 of one polarity and the unit electrode 3 of the other polarity are independently supported. In the plasma generating electrode 1, since the ends of the unit electrode 3 of the other polarity are not secured by the support protrusion 37, the unit electrodes 2 and 32 can freely expand and contract even when the unit electrode 32 of one polarity and the unit electrode 3 of the other polarity differ in the coefficient of thermal expansion or the like to a large extent, so that thermal stress can be efficiently released. In FIGS. 6 and 7, elements configured in the same manner as the elements shown in FIGS. 1 to 3 are indicated by the same symbols. Description of these elements is omitted. In the plasma generating electrodes 21 and 31 shown in FIGS. 6 and 7, the unit electrodes 22 and 32 of one polarity are supported by applying stress to the unit electrodes in the directions indicated by the arrows in FIGS. 6 and 7.

In a known plasma generating electrode, when the support member for supporting the unit electrode is separately disposed on the ceramic dielectric, a creeping discharge may occur at the bonding surface between the ceramic dielectric and the support member. In the plasma generating electrode 1 according to one embodiment of the invention shown in FIGS. 1 and 2, since the support protrusion 7 is integrally formed with the ceramic dielectric 5, the area of the portion in which a creeping discharge may occur is decreased. In the plasma generating electrode according to one embodiment of the invention, a creeping discharge occurring on the surface of the support protrusion 7 can be efficiently prevented by setting the distance of the support protrusion 7 from the surface forming the discharge space 4 to the end face on one end in one direction to be equal to or greater than five times the distance between the unit electrode 2 of one polarity and the unit electrode 3 of the other polarity opposite to each other, so that the discharge voltage can be increased.

Figure 8:
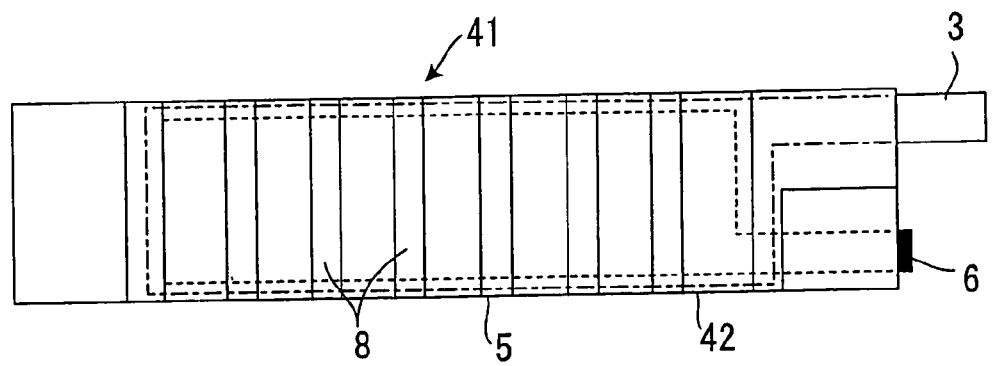
FIG. 8 is a plan view of another embodiment of the plasma generating electrode according to the invention (first aspect of the invention) viewed from the surface side of the unit electrode.
Figure 9:
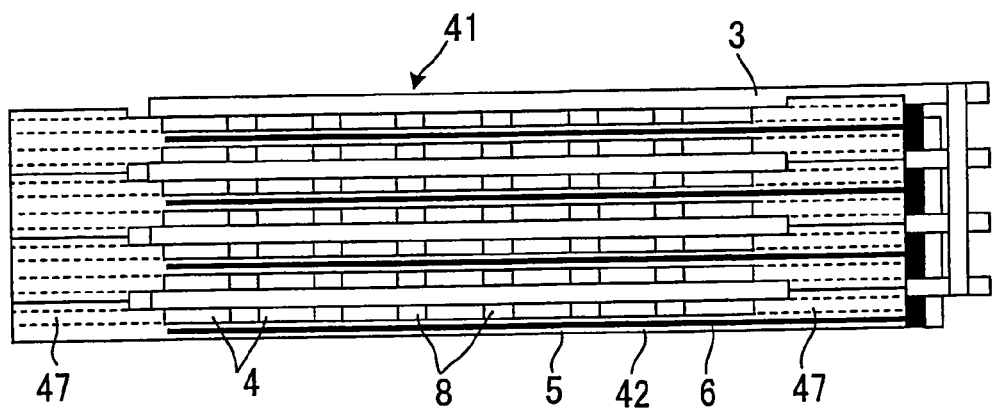
FIG. 9 is a cross-sectional view of the plasma generating electrode shown in FIG. 8 along a plane perpendicular to the surface of the unit electrode.

In the plasma generating electrode 1 shown in FIGS. 1 to 3, the unit electrode 2 of one polarity and the unit electrodes 3 of the other polarity are configured so that electrical connection is achieved on opposite ends in one direction. As shown in FIGS. 8 and 9, a plasma generating electrode 41 may be formed in which electrical connection is achieved on only one end in one direction. In the plasma generating electrode 41, a unit electrode 42 of one polarity and the unit electrode 3 of the other polarity are independently supported. The unit electrodes 3 of the other polarity can be removed from the unit electrode 42 of one polarity by moving the unit electrodes 3 in parallel to the direction in which the unit electrodes 3 are disposed.

Figure 10:
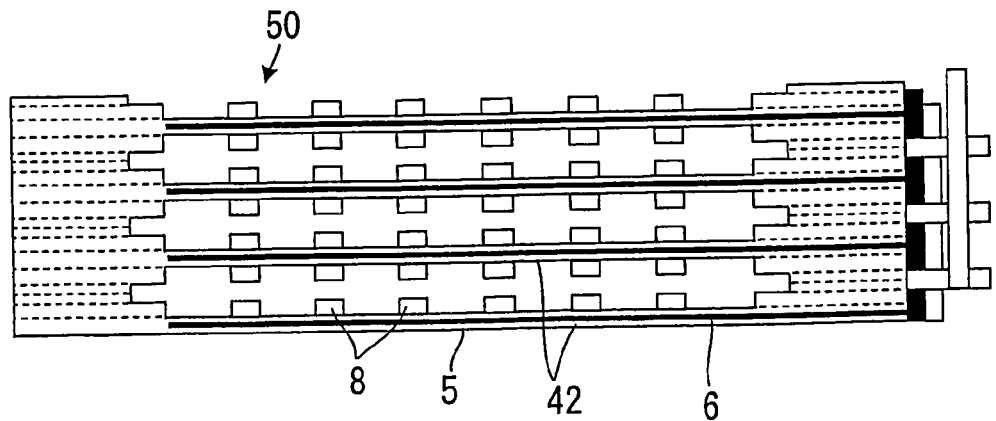
FIG. 10 is a cross-sectional view of an electrode unit formed by the unit electrodes of one polarity along a plane perpendicular to the surface of the unit electrode.

In the plasma generating electrode 41 shown in FIGS. 8 and 9, since the unit electrodes 3 of the other polarity can be removed from the unit electrode 42 of one polarity, an electrode unit 50 (electrode unit of one polarity) may be formed by connecting the support protrusions 47 of the unit electrodes 42 of one polarity, as shown in FIG. 10. The plasma generating electrode 41 shown in FIG. 9 can be formed by providing the unit electrodes 3 of the other polarity (see FIG. 9) to the electrode unit 50 of one polarity formed by the unit electrodes 42 of one polarity. The number of parts of the plasma generating electrode 41 is further reduced by forming the electrode unit 50 (see FIG. 10) by the unit electrodes 42 of one polarity, whereby the assembly is facilitated. Since all the unit electrodes 42 of one polarity are integrated, misalignment between the unit electrodes 42 of one polarity is prevented, whereby the unit electrodes 3 of the other polarity can be accurately and simply positioned. In the electrode unit 50, since the surfaces of the support protrusions 47 are connected, a creeping discharge does not occur on the surface of the support protrusion 47 even when disposing metal unit electrodes opposite to each other, whereby the discharge voltage can be increased. In FIGS. 8 to 10, elements configured in the same manner as the elements shown in FIGS. 1 to 3 are indicated by the same symbols. Description of these elements is omitted.

The integrally fired electrode unit 50 may be formed by stacking unfired formed bodies, bonding the stacked formed bodies at the surfaces of the support protrusions 47, and firing the integrated product. In this case, the reliability of the bonding interface can be increased by applying an adhesion promoter containing an electrode component to the bonding surface of the support protrusion 47. In the case where the plasma generating electrode is used at a low temperature and stress applied to the plasma generating electrode is low, the electrode unit 50 may be formed by stacking the fired unit electrodes 42, applying a glass material with a composition showing thermal expansion similar to that of the electrode material to the surface of the support protrusion 47, and bonding the support protrusions 47 by melting the glass material.

Figure 11:
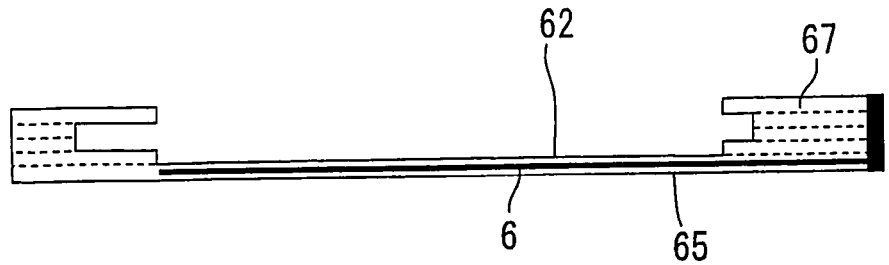
FIG. 11 is a cross-sectional view showing an example of the unit electrode forming another embodiment of the plasma generating electrode according to the invention.
Figure 12:
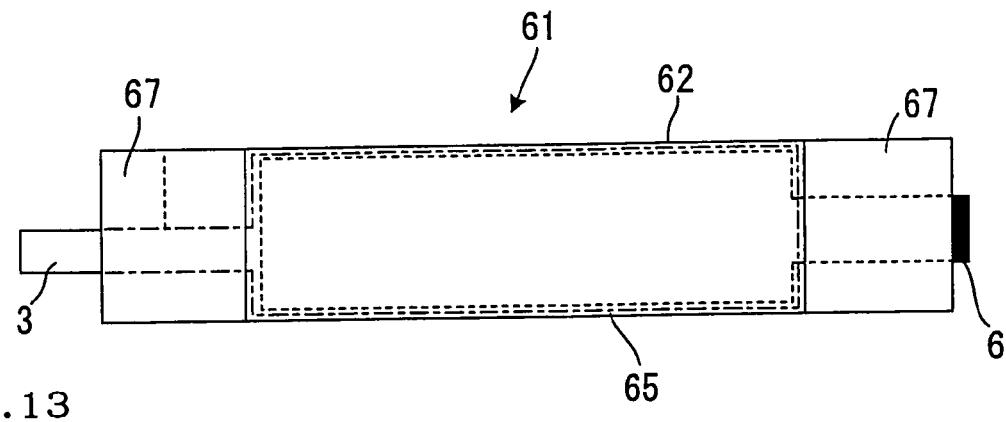
FIG. 12 is a cross-sectional view of the plasma generating electrode using the unit electrode shown in FIG. 11 along a plane perpendicular to the surface of the unit electrode.

In the plasma generating electrode 1 shown in FIG. 2, the support protrusions 7 having almost the identical shape are formed on each surface of the ceramic dielectric opposite to the unit electrode 3 of the other polarity. As shown in FIGS. 11 and 12, a plasma generating electrode 61 may also be formed in which support protrusions 67 are formed only on one surface of a ceramic dielectric 65 forming a unit electrode 62 of one polarity, for example. The support protrusion 67 has a shape formed by integrating the support protrusions 7 formed on the surfaces of the ceramic dielectric 5 shown in FIG. 3. The unit electrode 62 of one polarity shown in FIGS. 11 and 12 supports the surface of another unit electrode of one polarity (not shown), on which the support protrusion is not formed, by the support protrusions 67. FIG. 11 is a cross-sectional view showing an example of the unit electrode forming another embodiment of the plasma generating electrode according to the invention, and FIG. 12 is a plan view of the plasma generating electrode using the unit electrode shown in FIG. 11 viewed from the surface side of the unit electrode.

Figure 13:
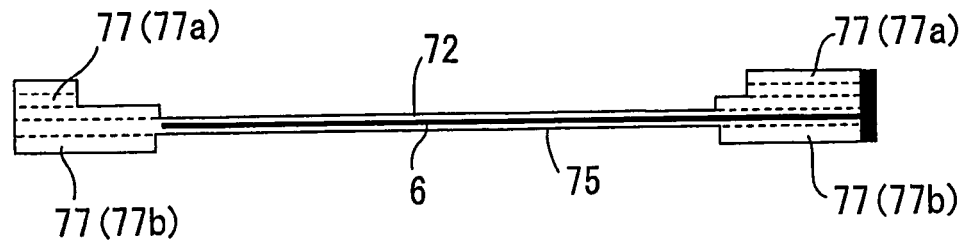
FIG. 13 is a cross-sectional view showing an example of the unit electrode forming another embodiment of the plasma generating electrode according to the invention.
Figure 14:
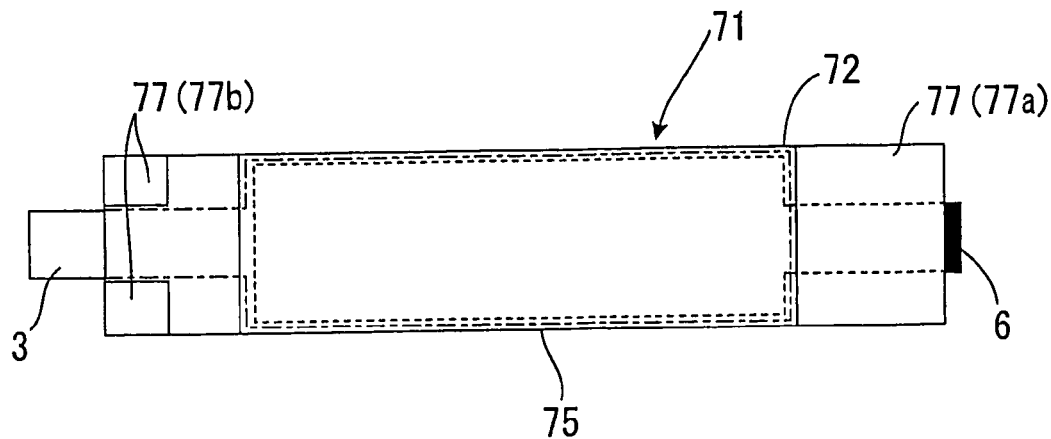
FIG. 14 is a cross-sectional view of the plasma generating electrode using the unit electrode shown in FIG. 13 along a plane perpendicular to the surface of the unit electrode.

As shown in FIGS. 13 and 14, a plasma generating electrode 71 may be formed in which support protrusions 77 formed on the surfaces of a ceramic dielectric 75 forming a unit electrode 72 of one polarity have different shapes. Support protrusions 77a and 77b having different shapes are shaped so that a part of the support protrusion 7 on one surface of the ceramic dielectric 5 shown in FIG. 3 is moved to the support protrusion 7 on the other surface. The support protrusions 77a and 77b having different shapes form a pair by stacking the unit electrodes 72 of one polarity shown in FIGS. 13 and 14 to form a specific discharge space 4 (see FIG. 2). FIG. 13 is a cross-sectional view showing an example of a unit electrode forming another embodiment of the plasma generating electrode according to the invention, and FIG. 14 is a plan view of the plasma generating electrode using the unit electrode shown in FIG. 13 viewed from the surface side of the unit electrode. In FIGS. 11 to 14, elements configured in the same manner as the elements shown in FIGS. 1 to 3 are indicated by the same symbols. Description of these elements is omitted.

Figure 15A:
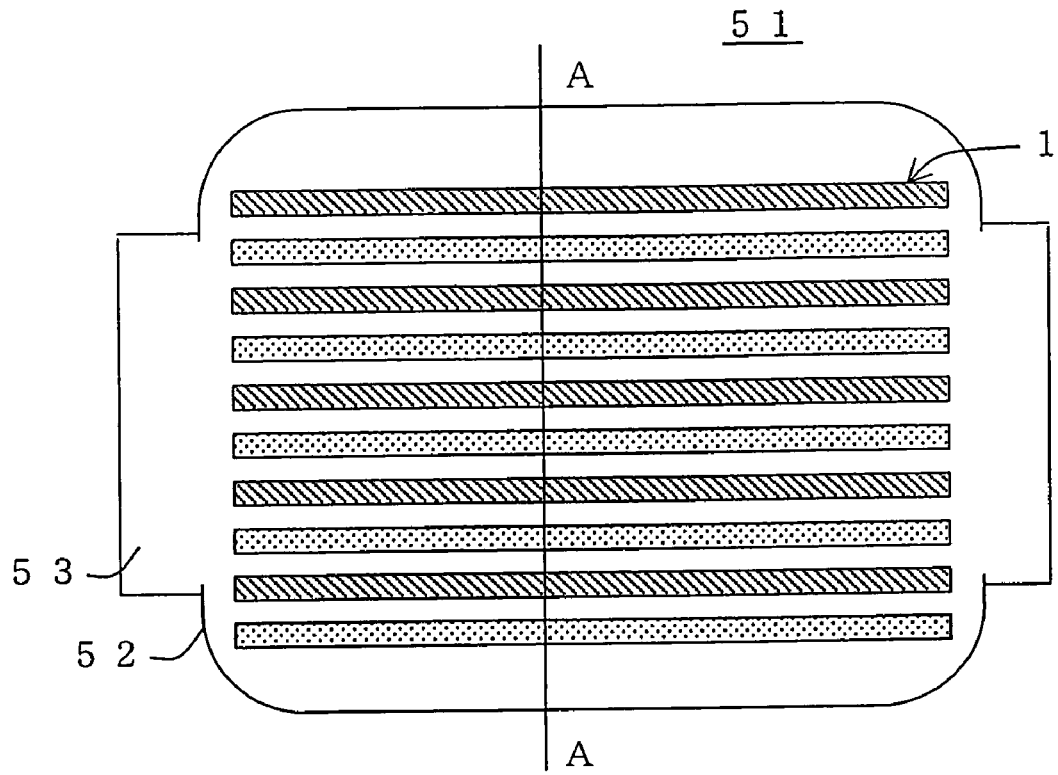
FIG. 15(a) is a cross-sectional view of one embodiment of a plasma reactor according to the invention (second aspect of the invention) along a plane perpendicular to the surface of a unit electrode forming a plasma generating electrode.

One embodiment of the plasma reactor according to the invention (second aspect of the invention) is described below in detail. FIG. 15(a) is a cross-sectional view showing one embodiment of the plasma reactor according to the invention along a plane perpendicular to the surface of a unit electrode forming a plasma generating electrode, and FIG. 15(b) is a cross-sectional view along the line A-A shown in FIG. 15(a).

Figure 15B:
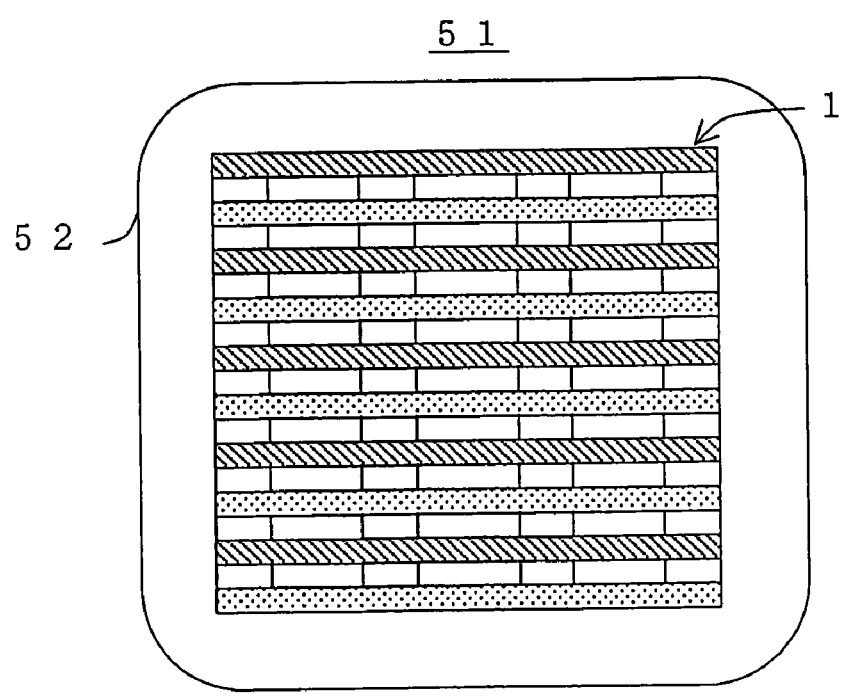
FIG. 15(b) is a cross-sectional view along the line A-A shown in FIG. 15(a).

As shown in FIGS. 15(a) and 15(b), a plasma reactor 51 according to one embodiment of the invention includes one embodiment (plasma generating electrode 1) of the plasma generating electrode according to the invention (first aspect of the invention) as shown in FIG. 2, and a casing 52 having a passage (gas passage 53) for a gas containing a specific component formed therein, in which, when the gas is introduced into the gas passage 53 of the casing 52, the specific component contained in the gas can be reacted by plasma generated by the plasma generating electrode 1. The plasma reactor 51 according to one embodiment of the invention may be suitably used as an exhaust gas treatment device or an ozonizer which produces ozone by reacting oxygen in air, for example. As described above, the plasma generating electrode 1 used for the plasma reactor 51 according to one embodiment of the invention is configured so that the support protrusion 7 of the unit electrode 2 of one polarity is integrally fired with the ceramic dielectric 5 on at least one end of the ceramic dielectric 5 in one direction, and two adjacent unit electrodes 2a and 2b of one polarity are supported by the support protrusions 7 of the unit electrodes 2 of one polarity. Therefore, uniform plasma can be stably generated.

The material for the casing 52 forming the plasma reactor 51 according to one embodiment of the invention shown in FIGS. 15(a) and 15(b) is not particularly limited. As the material for the casing 52, it is preferable to use ferritic stainless steel exhibiting excellent conductivity, being lightweight and inexpensive, and showing only a small amount of deformation due to thermal expansion, for example.

The plasma reactor according to one embodiment of the invention may further include a power supply (not shown) for applying voltage to the plasma generating electrode. As the power supply, a known power supply may be used insofar as it can supply current which can cause plasma to be effectively generated. It is preferable that the power supply be a pulsed power supply. It is still more preferable that the power supply include at least one SI thyristor. Plasma can be more efficiently generated by using such a power supply.

The plasma reactor according to one embodiment of the invention may include an electricity supply part such as an outlet so that current is supplied from an external power supply, instead of providing a power supply in the plasma reactor.

Current supplied to the plasma generating electrode forming the plasma reactor may be appropriately selected depending on the intensity of plasma to be generated. When installing the plasma reactor in an automotive exhaust system, it is preferable that current supplied to the plasma generating electrode be a direct current at a voltage of 1 kV or more, a pulsed current having a peak voltage of 1 kV or more and a pulse rate per second of 100 or more (100 Hz or more), an alternating current having a peak voltage of 1 kV or more and a frequency of 100 or more (100 Hz or more), or a current generated by superimposing two types of such a current. This configuration enables plasma to be efficiently generated.

EXAMPLES

The invention is described below in detail by way of examples. However, the invention should not be construed as being limited to the following examples.

A ceramic dielectric was prepared as follows. A slurry for forming a ceramic dielectric ceramic green sheet was prepared using an aluminum oxide powder with a purity of 93 mass %. A ceramic dielectric ceramic green sheet having a rectangular surface shape (length: 120 mm, width: 50 mm) and having a thickness of 0.5 mm was formed in the shape of a tape using the resulting slurry. A pair of the resulting ceramic dielectric ceramic green sheets was used by placing the ceramic green sheets one on top of the other and integrating the stacked ceramic green sheets. A conductive paste using tungsten was printed on one surface of one of the pair of ceramic dielectric ceramic green sheets to a length of 78 mm, a width of 48 mm, and a thickness of 0.01 mm to form a conductive film. In order to provide electrical connection to the conductive film, the conductive film was printed to reach the end of the surface of the ceramic dielectric ceramic green sheet at a width of 10 mm so that an electrode terminal with a length of 10 mm could be formed at the center of the end face of the unit electrode.

The pair of ceramic dielectric ceramic green sheets thus obtained was stacked and integrated so that the printed conductive film was covered to form an unfired unit electrode precursor.

Then, a first protrusion forming ceramic green sheet for forming a discharge space in a plasma generating electrode was formed using a slurry similar to the slurry by which the ceramic dielectric ceramic green sheet was formed. The first protrusion forming ceramic green sheet had a length of 20 mm, a width of 50 mm, and a thickness of 1.0 mm. The ceramic green sheet was stacked on the surfaces of the unfired unit electrode precursor on each end in one direction (four locations in total) to obtain a discharge space protrusion containing unfired unit electrode.

Then, a second protrusion forming ceramic green sheet for forming at least a part of the space in which another unit electrode was disposed was formed using a slurry similar to the slurry by which the ceramic dielectric ceramic green sheet and the first protrusion forming ceramic green sheet were formed. The second protrusion forming ceramic green sheet was stacked and integrated with the first protrusion forming ceramic green sheet to obtain a support protrusion containing unfired unit electrode in which the discharge space and at least a part of the space in which another unit electrode was disposed were formed and a support protrusion for supporting the unit electrode was integrally formed.

The second protrusion forming ceramic green sheet had different shapes on one end, on which an electrode terminal was formed on the unit electrode, and the other end. On the end on which the electrode terminal was formed, a sheet having a length of 15 mm, a width of 50 mm, and a thickness of 0.5 mm was respectively stacked on the first protrusion forming ceramic green sheet on each surface of the discharge space protrusion containing unfired unit electrode. On the end opposite to the end on which the electrode terminal was formed, a sheet having a length of 10 mm, a width of 10 mm, and a thickness of 0.5 mm was respectively stacked on each surface of the discharge space protrusion containing unfired unit electrode on each end (four locations in total).

The resulting unfired unit electrode was fired at 1450° C. to obtain the unit electrode 12 of one polarity as shown in FIG. 4, which is one of the opposing unit electrodes. Ten unit electrodes of one polarity thus obtained were stacked with ten stainless steel unit electrodes (unit electrodes of the other polarity) having a length of 90 mm, a width of 50 mm, and a thickness of 0.9 mm interposed therebetween to obtain the plasma generating electrode 31 as shown in FIG. 7. In the stainless steel unit electrode used as the unit electrode 3 of the other polarity, the end opposite to the connection terminal disposed on the unit electrode 32 of one polarity extends to the outside at a width of 10 mm and a length of 20 mm and serves as a connection terminal. The resulting plasma generating electrode 31 was connected with a pulsed power supply including an SI thyristor, and was disposed in a stainless steel (430SS) casing to obtain a plasma reactor.

A heat cycle test, in which a gas at 600° C. and a gas at room temperature were alternately caused to flow through the plasma reactor thus obtained, was performed in 100 cycles. As a result, breakage of the plasma generating electrode in the plasma reactor was not observed, and a discharge test at 1 kpps and 100 mJ load could be performed.

In the plasma generating electrode according to the invention, the hierarchically stacked unit electrodes are accurately and simply positioned, and deformation of the unit electrodes due to thermal stress is effectively prevented. Therefore, the plasma generating electrode according to the invention may be suitably used for an air cleaner or an exhaust gas treatment device which treats exhaust gas discharged from an automotive engine, incinerator, or the like by utilizing plasma, for example. Since the plasma reactor according to the invention includes the plasma generating electrode according to the invention, the plasma reactor exhibits high reactivity.

What is claimed is:
1. A plasma generating electrode comprising:
two types of plate-shaped unit electrodes of different polarities, the two types of unit electrodes of different polarities being hierarchically and alternately stacked at specific intervals, and
a discharge space for generating plasma being formed between opposing unit electrodes,
each of the unit electrodes of one polarity among the two types of unit electrodes of different polarities including a plate-shaped conductor exhibiting conductivity and a ceramic dielectric disposed to cover the conductor,
the ceramic dielectric of the unit electrode of one polarity including a support protrusion for forming the discharge space for generating plasma between the opposing unit electrodes and at least a part of a space in which the unit electrode of the other polarity is disposed opposite to the unit electrode of one polarity and for supporting the unit electrode of one polarity, the support protrusion being integrally formed with the ceramic dielectric on at least one surface of the ceramic dielectric on at least one end of the ceramic dielectric in one direction,
the support protrusions of adjacent unit electrodes of one polarity defining a gap, the gap defined at the at least one end of the ceramic dielectric in the one direction and extends from an interior side of the support protrusions at the end of the ceramic dielectric to an exterior side of the support protrusions, and
both ends of the unit electrode of one polarity being integrally fixed to their respective support protrusions, with neither end of the unit electrode of the other polarity being integrally fixed to the support protrusions, and a stress on the support protrusions of the adjacent unit electrodes of one polarity supports the electrodes of the other polarity.

2. The plasma generating electrode according to claim 1, wherein the two types of unit electrodes of different polarities are formed of different materials.

3. The plasma generating electrode according to claim 1, wherein the unit electrode of the other polarity is formed by a plate-shaped member having a coefficient of thermal expansion and/or a Young's modulus differing from a coefficient of thermal expansion and/or a Young's modulus of the ceramic dielectric forming the unit electrode of one polarity.

4. The plasma generating electrode according to claim 1, wherein the unit electrode of the other polarity is formed by a plate-shaped conductive metal or alloy member exhibiting conductivity.

5. The plasma generating electrode according to claim 1, wherein the space which is formed by allowing the support protrusion to support the unit electrode of one polarity and in which the unit electrode of the other polarity is disposed has a length in a direction of a thickness of the unit electrode of the other polarity greater than the thickness of the unit electrode of the other polarity.

6. The plasma generating electrode according to claim 1, wherein the space which is formed by allowing the support protrusion to support the unit electrode of one polarity and in which the unit electrode of the other polarity is disposed has a length in a direction of a thickness of the unit electrode of the other polarity equal to or smaller than the thickness of the unit electrode of the other polarity.

7. The plasma generating electrode according to claim 1, wherein a distance of the support protrusion from a surface forming the discharge space to an end face on the end in the direction is equal to or greater than five times a distance between the unit electrode of one polarity and the unit electrode of the other polarity opposite to each other.

8. The plasma generating electrode according to claim 1, wherein the ceramic dielectric forming the unit electrode of one polarity includes at least one compound selected from the group consisting of aluminum oxide, magnesium oxide, silicon oxide, silicon nitride, aluminum nitride, mullite, spinel, cordierite, magnesium-calcium-titanium type oxide, barium-titanium-zinc type oxide, and barium-titanium type oxide.

9. The plasma generating electrode according to claim 1, wherein the ceramic dielectric forming the unit electrode of one polarity is formed by stacking a plate-shaped ceramic member and a protrusion member forming the support protrusion.

10. The plasma generating electrode according to claim 1, wherein the conductor forming the unit electrode of one polarity includes at least one metal selected from the group consisting of tungsten, molybdenum, manganese, chromium, titanium, zirconium, nickel, iron, silver, copper, platinum, and palladium.

11. A plasma reactor comprising the plasma generating electrode according to claim 1, and a casing having a passage (gas passage) for a gas containing a specific component formed therein, wherein, when the gas is introduced into the gas passage of the casing, the specific component contained in the gas can be reacted by plasma generated by the plasma generating electrode.

12. The plasma reactor according to claim 11, comprising at least one pulsed power supply for applying voltage to the plasma generating electrode.

13. The plasma reactor according to claim 12, wherein the pulsed power supply includes at least one SI thyristor.

* * * * *